(12) United States Patent
Cheah

(10) Patent No.: US 11,050,402 B2
(45) Date of Patent: Jun. 29, 2021

(54) ELECTRONICALLY ADJUSTABLE INDUCTOR CIRCUIT

(71) Applicant: NATIONAL INSTRUMENTS CORPORATION, Austin, TX (US)

(72) Inventor: Chin-Hong Cheah, Pulau Pinang (MY)

(73) Assignee: National Instruments Corporation, Austin, TX (US)

( * ) Notice: Subject to any disclaimer, the term of this patent is extended or adjusted under 35 U.S.C. 154(b) by 96 days.

(21) Appl. No.: 16/575,850

(22) Filed: Sep. 19, 2019

(65) Prior Publication Data

US 2021/0091744 A1    Mar. 25, 2021

(51) Int. Cl.
*H03H 7/40*   (2006.01)
*H01F 21/02*  (2006.01)

(52) U.S. Cl.
CPC .............. *H03H 7/40* (2013.01); *H01F 21/02* (2013.01)

(58) Field of Classification Search
CPC ........... H01F 38/14; H01F 21/02; H03H 7/40; H02M 3/158; H02M 3/1584; H02M 1/425; H02M 3/33569; H02M 3/33592; H02M 1/34; H02M 1/14; H02M 3/156
See application file for complete search history.

(56) References Cited

U.S. PATENT DOCUMENTS

| | | |
|---|---|---|
| 4,399,372 A | 8/1983 | Tanimoto et al. |
| 6,664,860 B2 | 12/2003 | Fallisgaard et al. |
| 6,943,588 B1 | 9/2005 | Luo et al. |
| 9,455,646 B2 * | 9/2016 | Zhou ................. H02M 1/12 |
| 2009/0230929 A1 * | 9/2009 | Sui ......................... G05F 1/70 323/207 |
| 2009/0267658 A1 * | 10/2009 | Bridge ............... H02M 3/1584 327/141 |
| 2016/0276924 A1 * | 9/2016 | Castelli ............ H02M 3/33515 |
| 2017/0070163 A1 * | 3/2017 | Pahlevaninezhad ........................ H02M 7/5387 |

* cited by examiner

*Primary Examiner* — John W Poos
(74) *Attorney, Agent, or Firm* — Kowert, Hood, Munyon, Rankin & Goetzel P.C.; Jeffrey C. Hood; Luke Langsjoen

(57) ABSTRACT

Circuits and methods for electronically adjusting an effective inductance of one or more primary inductors in a circuit. The circuit may include a plurality of sub-circuits connected in parallel between an input and an output of the circuit. Each sub-circuit may include a primary inductor and an auxiliary inductor inductively coupled to the primary inductor. The circuit may further include first circuitry coupled to the primary inductor, wherein the first circuitry configured to introduce an oscillating first voltage across the primary inductor; and second circuitry coupled to the auxiliary inductor, wherein the second circuitry is configured to introduce an oscillating second voltage across the auxiliary inductor. The amplitudes of the second voltages may be selected to reduce a difference between effective inductances of the primary inductors.

20 Claims, 19 Drawing Sheets

ELECTRONICALLY ADJUSTABLE INDUCTOR CIRCUIT

BACKGROUND

Inductors available on the market may have a variance in their physical inductance that is unacceptably large for certain circuit applications. Additionally, methods for correcting a mismatch between inductances of multiple inductors in a circuit may be costly, time intensive, and/or of insufficient precision. Accordingly, improvements in the field are desirable.

SUMMARY

Described herein are embodiments relating to circuits and methods for electronically adjusting an effective inductance of one or more primary inductors in a circuit.

In some embodiments, the circuit may include a plurality of sub-circuits connected in parallel between an input and an output of the circuit. Each sub-circuit may include a primary inductor and an auxiliary inductor inductively coupled to the primary inductor. The circuit may further include first circuitry coupled to the primary inductor, wherein the first circuitry configured to introduce an oscillating first voltage across the primary inductor; and second circuitry coupled to the auxiliary inductor, wherein the second circuitry is configured to introduce an oscillating second voltage across the auxiliary inductor. The amplitudes of the second voltages may be selected to reduce a difference between effective inductances of the primary inductors.

One or more of the second voltages may oscillate in phase with the respective first voltages to increase the effective inductance of the respective primary inductor, and/or one or more second voltages may oscillate 180° out-of-phase with the respective first voltages to decrease the effective inductance of the respective primary inductor.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present disclosure can be obtained when the following detailed description is considered in conjunction with the following drawings, in which.

Figure 1:
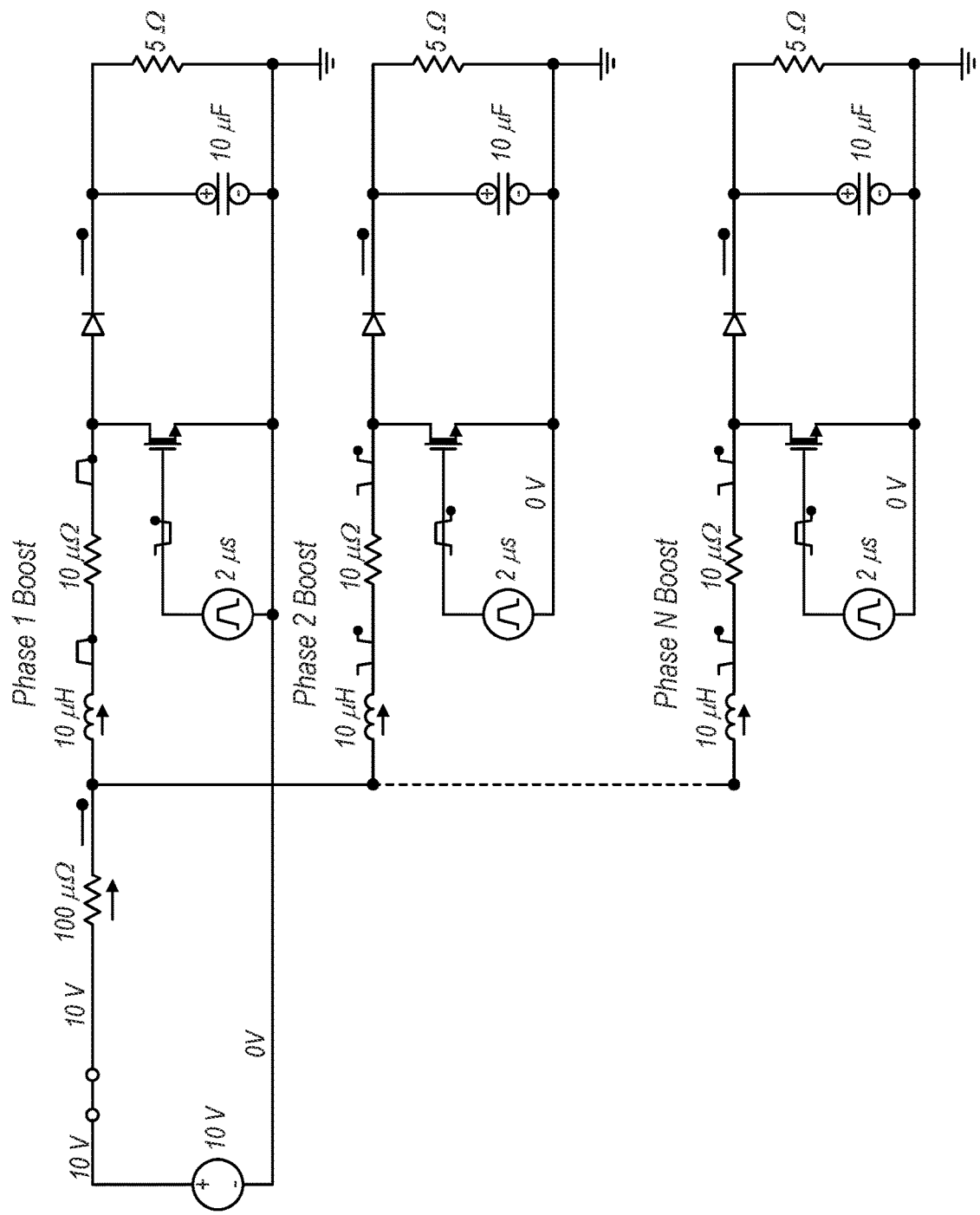
FIG. 1 is a detailed circuit diagram illustrating a parallelized phase-shifted programmable load circuit, according to some embodiments.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the intention is to cover all modifications, equivalents, and alternatives falling within the spirit and scope of the present disclosure as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of embodiments of the present disclosure. However, one having ordinary skill in the art should recognize that the disclosure may be practiced without these specific details. In some instances, well-known circuits, structures, and techniques have not been shown in detail to avoid obscuring the present disclosure.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually," wherein the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism," where the tasks are performed in an interleaved manner, e.g., by time multiplexing of execution threads.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

BACKGROUND

Inductors are employed in a vast range of circuit designs and topologies, due at least in part to their unique behaviors in the presence of variable current and other properties. However, inductors available on the market (and especially low-cost, mass-produced inductors) may have a large variance of up to 15-20% from their labelled inductance. The resultant inductance mismatch may present problems for proper circuit performance, particularly when a plurality of inductors are placed in parallel, but also for other circuit designs.

Figure 2:
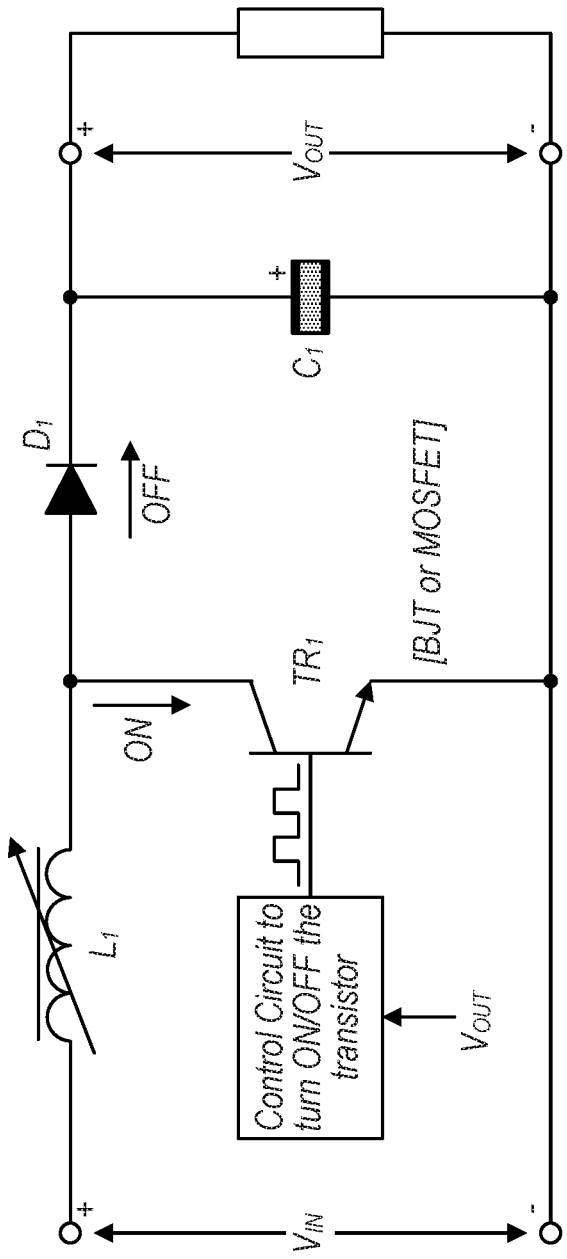
FIG. 2 is a circuit diagram illustrating a single phase of a boost switch mode power supply (SMPS) stage, according to some embodiments.

As one example, a plurality of inductors may be used in a programmable load circuit utilizing a parallel phase boost sub-circuits, such as that illustrated in FIG. 1. A more detailed circuit diagram illustrating a single phase of a boost switch mode power supply (SMPS) stage from the N-phase configuration is illustrated in FIG. 2. The circuits illustrated in FIGS. 1 and 2 are described in greater detail in the Appendix below. FIG. 1 is a detailed circuit diagram illustrating a parallelized phase-shifted programmable load circuit, according to some embodiments. As illustrated, a DUT (shown as a 10V voltage source on the left side of FIG. 1) is connected to N phase boost circuits. For simplicity, the phase boost circuits will be referred to herein as "first sub-circuits" of the overall programmable load circuit. As shown, each first sub-circuit includes an inductor coupled to a first switch. The first switch may operate in one of two states. While in the first state, the switch is off and current through the inductor is directed through a diode. Alternatively, in the second state the switch is on and connects the inductor to ground. Each first sub-circuit further includes a capacitor connected in parallel with a resistor, in the illustrated embodiment.

Figure 3:
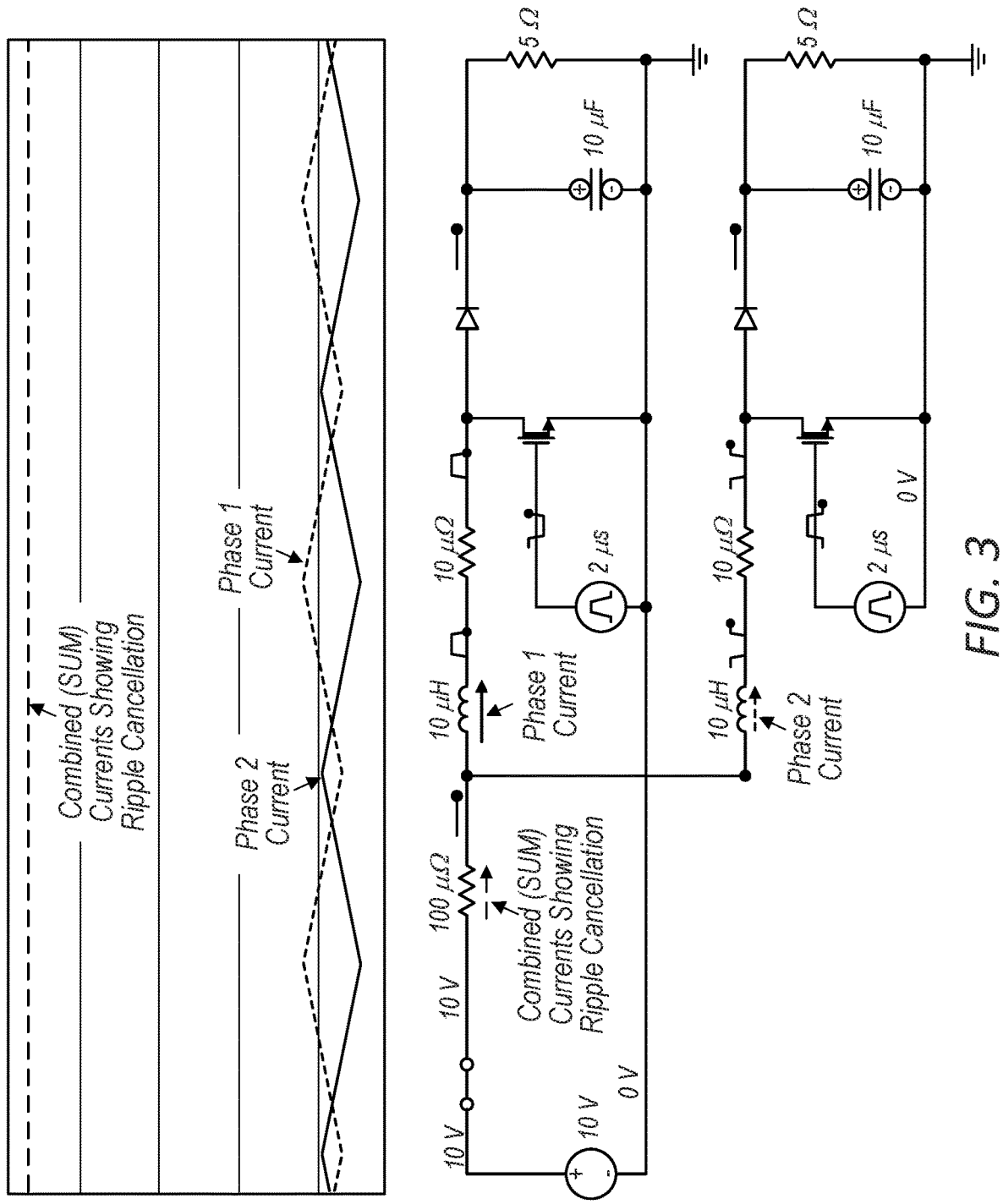
FIG. 3 illustrates the resultant currents through the first and second sub-circuits for a 2-phase topology, according to some embodiments.

When two or more boost-based topology switch mode power supplies (SMPSs) (i.e., two or more first sub-circuits) are operated in parallel, the switching phase of the N-phase parallel boost power supply stage may be shifted such that they are switching at an equally divided phase relative to each other (For example, for a 2-phase topoology, phases 1 and 2 may switch with a 180 degree phase shift. For a 3-phase topology, phases 1, 2 & 3 may switch with a 120 degree phase shift and for a 4-phase topology, phase 1, 2, 3 & 4 may switch with a 90 degree phase shift relative to each other, and so on). In other words, for a 3-phase topology, the second parallel circuit may operate 120 degrees behind the first parallel circuit, and the third parallel circuit may operate 120 degrees behind the second parallel circuit (and thereby 240 degrees behind the first parallel circuit), and so on. Advantageously, these phase shifts may create cancellation of the total input ripple current. For example, FIG. 3 illustrates the resultant currents through the first and second sub-circuits for a 2-phase topology, wherein the two currents are 180° out-of-phase and the sum of the two currents is therefore constant or at least approximately constant.

Figure 4:
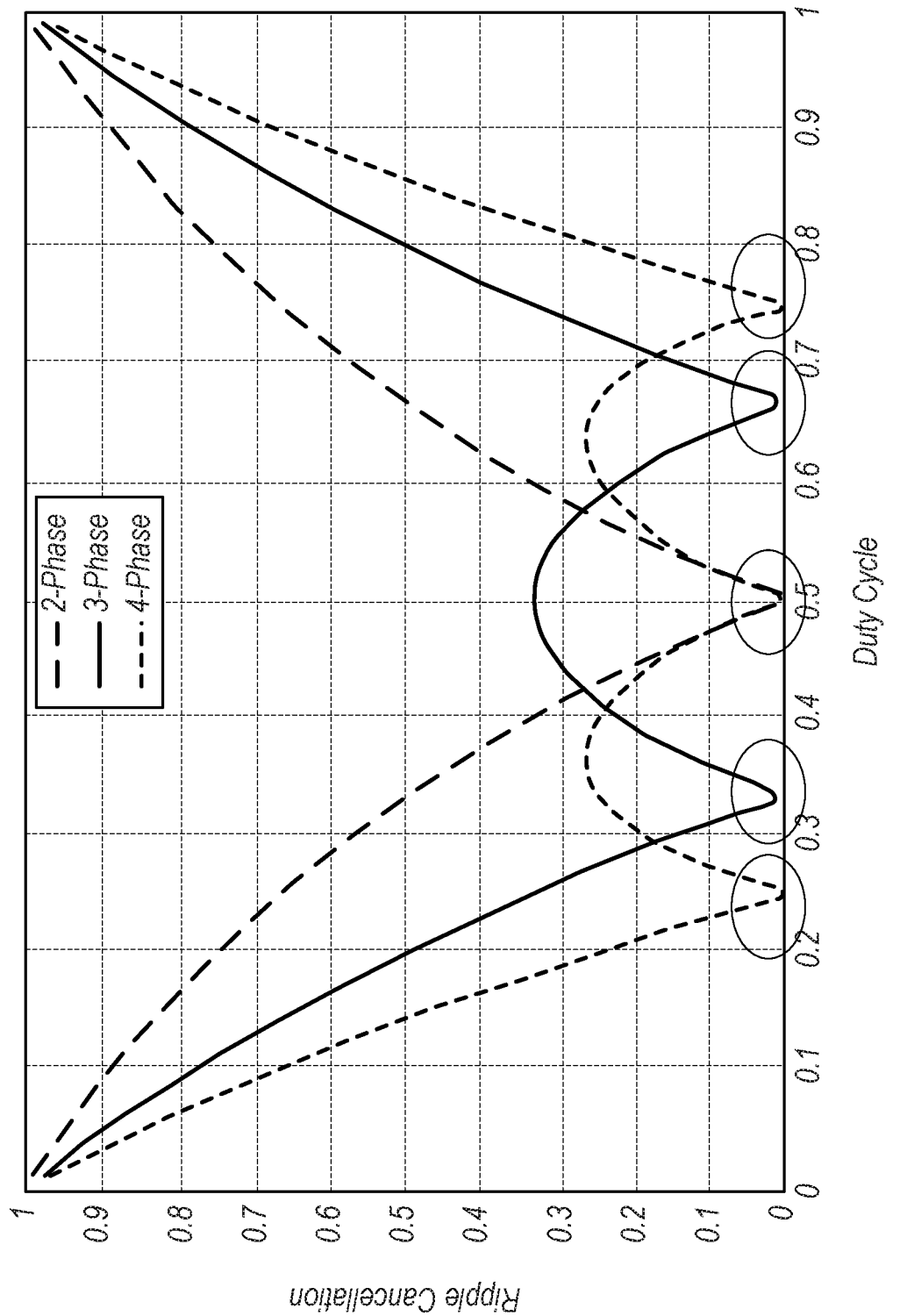
FIG. 4 illustrates the degree of current ripple cancellation as a function of duty cycle for 2, 3, and 4-phase topologies, according to some embodiments.

FIG. 4 illustrates the degree of current ripple cancellation as a function of duty cycle for 2, 3, and 4-phase topologies. Note that the duty cycle, as used herein, refers to the ratio of the time that a switch operates in the on position to the total period of oscillation between the on position and the off position. For example, a 0.25 or 25% duty cycle for a switch means that a switch spends 25% of the time in the on position and 75% of the time in the off position. As illustrated, theoretical complete ripple cancellation occurs when the duty cycle of the phase shifted, N-phase boost topology is switching at a duty cycle where N multiplied by the operating duty cycle is an integer. Note that each sub-circuit is phase-shifted but all sub-circuits operate at the same duty cycle. For example, as illustrated, for a 2 phase system, theoretical 100% cancellation occurs at a duty cycle of 0.5, or 50%. Similarly, for a 3 or 4 phase system, full cancellation occurs at additional operating duty cycle values as circled.

However, an issue may arise that affects the perfect or near-perfect cancellation of the input ripple current if the manufacturing tolerance of the boost inductors of each phase are not sufficiently matched. To address these and other concerns, embodiments herein present circuits and methods for achieving electronically adjustable inductor circuits.

Figure 5:
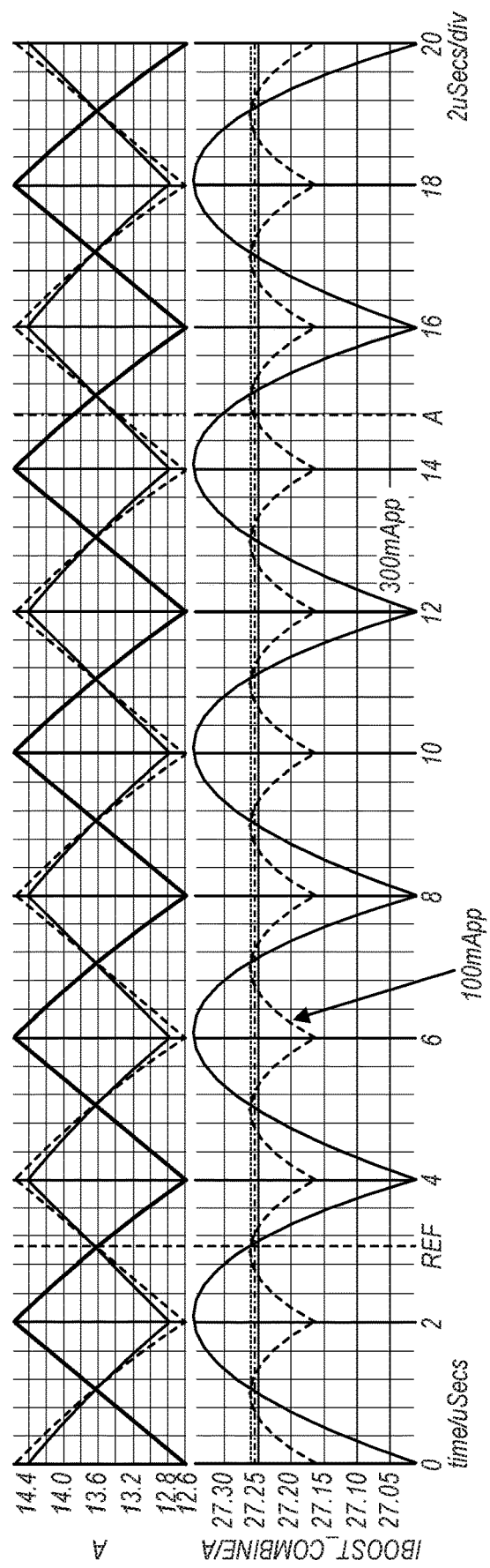
FIG. 5 is a graph illustrating how a mismatch of 20% in two parallel boost inductors affects current ripple cancellation, according to some embodiments.

FIG. 5 illustrates how a mismatch of 20% in two parallel boost inductors affects current ripple cancellation. As illustrated, the phase 2 inductor (blue graph) has a boost inductance that is 20% larger than the phase 1 inductor, resulting in a peak-to-peak ripple of phase 2 that has a smaller amplitude than the ripple of phase 1 (dotted blue line shows the original phase 2 peak-to-peak input ripple current when inductors are perfectly matched). This mismatch may result in an imperfect cancellation of the total input current and a subsequent increase in the input peak-to-peak current noise.

Embodiments herein describe methods and circuits for electronically adjusting one or more inductor values such that the mismatch in the inductance between the phases can be reduced and increased cancellation may be achieved.

Mechanically Adjustable Inductor

Current implementations for adjusting inductance of an inductor to reduce inductor mismatch in a circuit are subject to various disadvantages, which are addressed by embodiments described herein. In some current implementations, if it is desirable to adjust the inductance of an inductor, a mechanically adjustable inductor may be employed. Mechanically adjustable inductors may typically be adjusted via an adjustable screw or pot which adjusts either the length of the magnetic core that is coupled by the winding or the effective number of windings used by means of the wiper on the wire coil. Although a mechanically adjustable inductor may function to reduce inductance mismatch, at high current and/or large inductances its physical size may be very large, resulting in an undesirably large and/or heavy form factor for the circuit.

Another method that may be used to reduce inductor mismatch is to measure the inductance values of the inductors prior to assembly at manufacturing, and to sort out sets of inductors that are closely matched in values. However, this method has disadvantages in that additional work and costs may be necessary at production to perform the sorting, and the matching may not be sufficiently close to achieve the desired reduction of inductance mismatch, for example. In addition, with an increased number of inductors in a circuit (e.g., an increased number of phases N used in the boost stage of a programmable load module system), matching increasing number of inductors becomes quickly more difficult to achieve.

Another alternative is to carefully control the manufacturing process of the inductor to ensure that the inductors are precisely wound to produce matched (or closely matched) inductors. However, this may result in expensive, custom precision inductors, increasing the cost of the overall circuit.

To address these and other concerns, some embodiments herein utilize an auxiliary inductor magnetically (i.e., inductively) coupled to each boost inductor to reduce inductor mismatch and achieve improved ripple current cancellation at the input of a N-phase boost SNIPS that is used as part of a switch mode based programmable load. As used herein, the inductors whose inductances are being adjusted to match other inductors in the circuit are referred to as "primary inductors", and the second inductors utilized to adjust the primary inductors are referred to as "auxiliary inductors". Further, the inductance of a primary inductor while connected in isolation to a simple circuit is referred to herein as the "physical inductance" of the primary inductor, while the adjusted inductance that is realized through the coupling of the primary inductor to the auxiliary inductor is referred to as the "effective inductance".

The electronic inductance matching methods described herein may be used in a variety of types of circuits, according to various embodiments. Broadly speaking, the described methods for electronic inductance adjustment may be employed in any circuit with one or more primary inductors exposed to an alternating voltage and/or current whose inductance it is desirable to modify. In some embodiments, there are two or more primary inductors connected in parallel in a circuit, and the performance of the circuit may be improved if the two or more primary inductors have their effective inductances matched. In some embodiments, the two or more primary inductors are utilized in a N-phase boost circuit which functions as a programmable load module, as described in FIGS. 1-3, 6-7, and 12-19, for example.

Auxiliary Inductor Coupling to Reduce Mismatch

Figure 6:
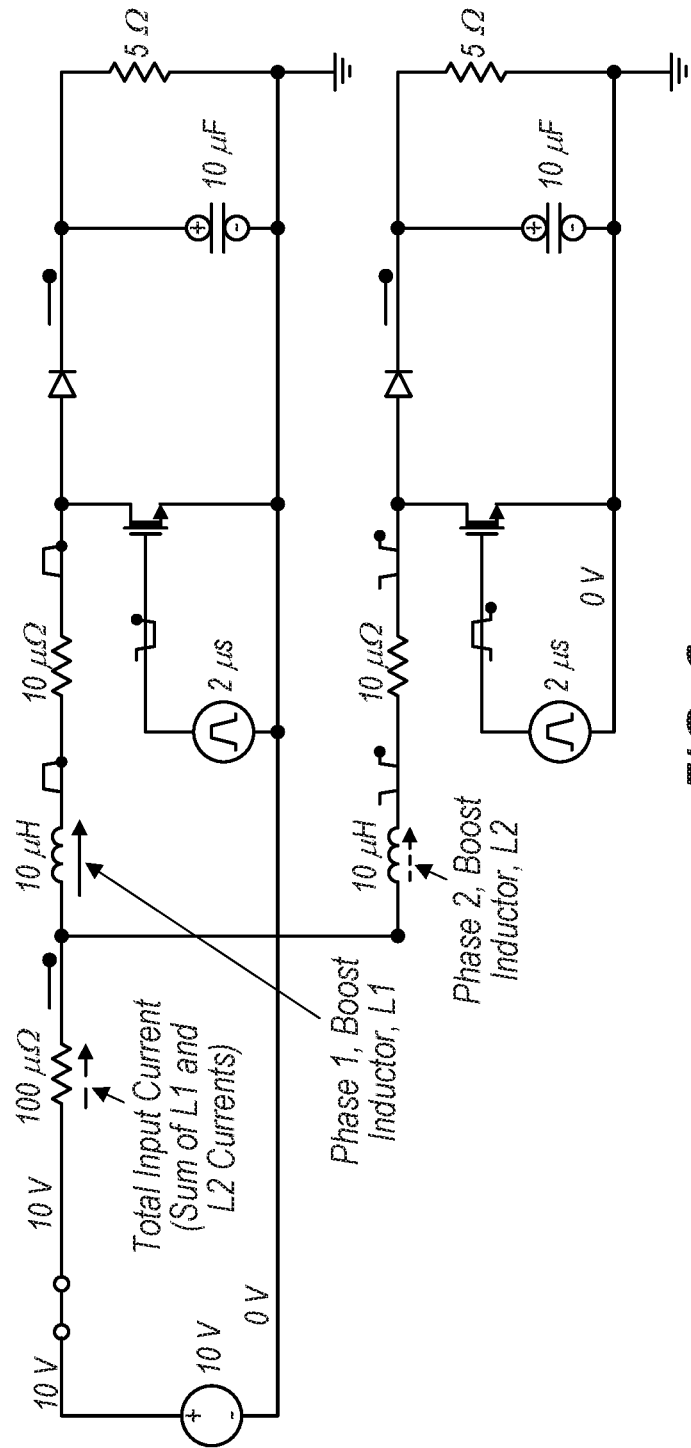
FIG. 6 is a circuit diagram of an exemplary 2-phase boost circuit, according to some embodiments.

FIG. 6 is a circuit diagram of an exemplary 2-phase boost circuit, according to some embodiments. As illustrated, the total input current is the sum of the L1 and L2 currents. With proper phase shifting of the switching phase between Phase 1 & 2, the inductor current ripple at L1 and L2 would be summed and cancelled at the input of the system (i.e., through the 100μΩ resistor).

However, because of manufacturing tolerances, the L1 and L2 inductances are unlikely to be a perfect match, resulting in a mismatch in the peak to peak ripple current at L1 and L2. As described above, this results in imperfect ripple cancellation of the resulting input current and hence a higher input ripple noise compared to if L1 and L2 were more closely matched.

Figure 7:
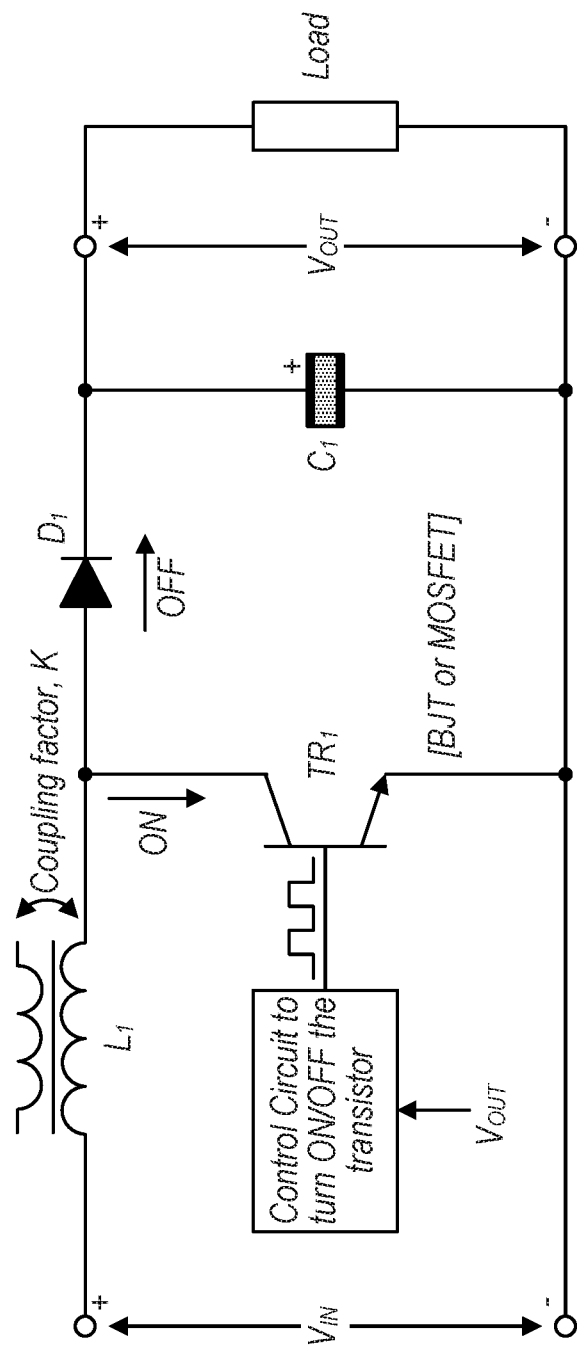
FIG. 7 is a circuit diagram illustrating an auxiliary conductor coupled to a primary conductor with a coupling factor, according to some embodiments.

Embodiments herein describe methods in which one or more of the inductances of the plurality of inductors are electronically adjusted such that they are trimmed towards a value that will result a closer match between the plurality of primary inductors in the circuit. For example, embodiments herein present methods to adjust the inductance of the $L_1$ inductor illustrated for a single phase in FIG. 2. Some embodiments employ an auxiliary winding onto the core of $L_1$ to create an 'auxiliary' or trim winding which has a certain coupling factor "K" to the main winding of $L_1$, as illustrated in FIG. 7. From the properties of mutual inductance, the alternating current (AC) ripple current on the primary inductor on $L_1$ may induce an electromotive force (EMF) onto the auxiliary inductor.

Figure 8:
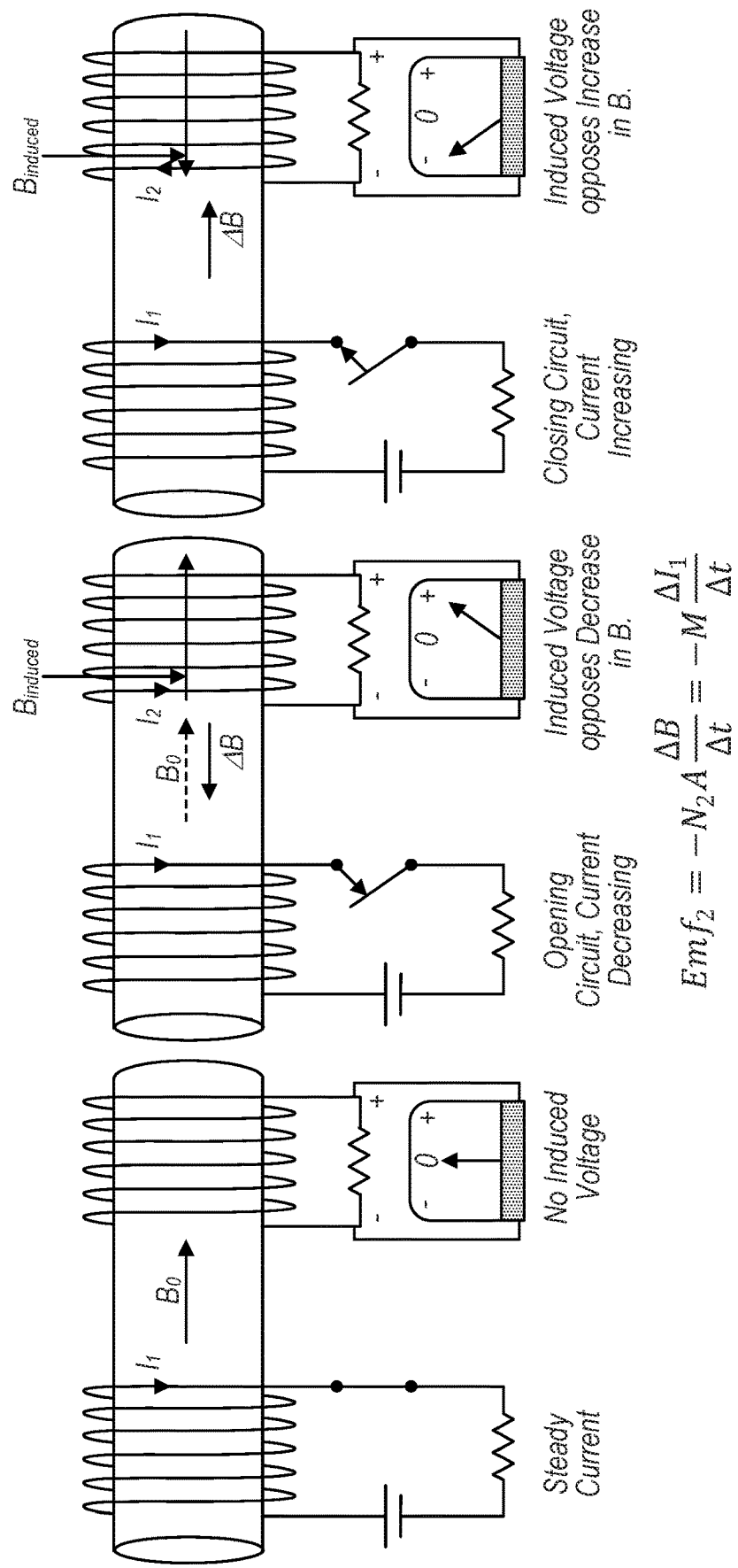
FIG. 8 illustrates a simplified example of two coupled windings, resulting in mutually coupled inductance, according to some embodiments.

FIG. 8 illustrates a simplified example of two coupled windings, resulting in mutually coupled inductance, according to some embodiments. For example, the left of the two windings in FIG. 8 may correspond to the primary inductor with a current $I_1$, and the right of the two windings may correspond to the auxiliary inductor with a current $I_2$. As illustrated, when a steady current flows through the primary inductor, no voltage is induced on the auxiliary inductor. However, when the circuit coupled to the primary inductor is opened, the current $I_1$ will decrease, resulting in an induced voltage on the auxiliary inductor that opposes the decrease in the magnetic field resulting from a decreasing $I_1$. Conversely, when the primary inductor circuit is closed, the current $I_1$ will increase and the induced voltage across the auxiliary inductor will likewise oppose the increase in the magnetic field resulting from an increasing $I_1$. Said another way, the induced current $I_2$ creates a magnetic field flux density through the primary inductor that is opposite in sign to the change in the magnetic field flux density introduced by the change in $I_1$. The measured EMF across the resistive 'load' across the auxiliary winding shows that the induced voltage also opposes the increase or decrease in the flux density, B.

Figure 9:
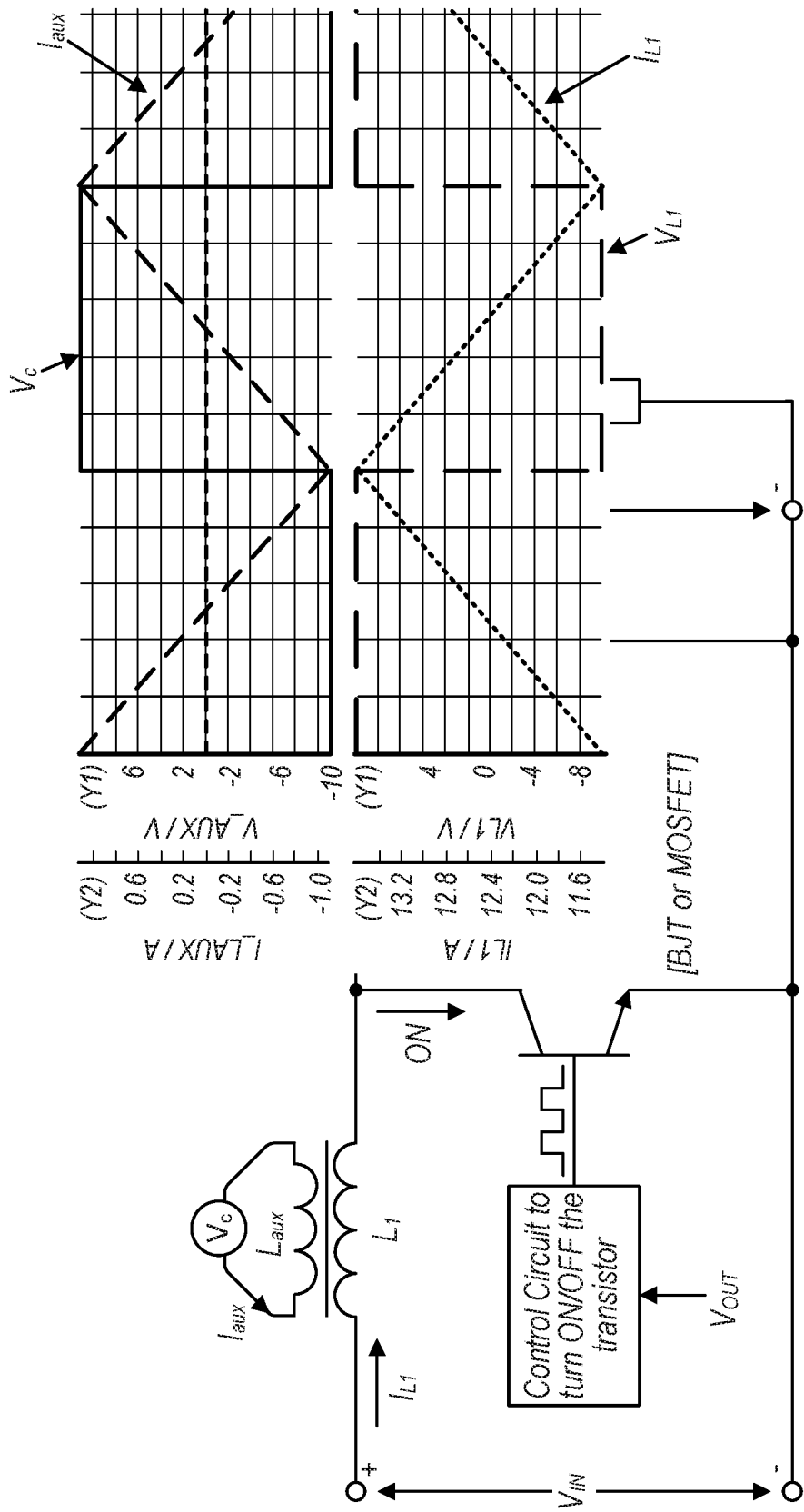
FIG. 9 is a circuit diagram and graph illustrating an alternating square voltage introduced across an auxiliary inductor, according to some embodiments.

In some embodiments, rather than coupling the auxiliary inductor to a simple resistor circuit as illustrated in FIG. 8, an alternating square voltage, $V_c$, is imposed across the auxiliary inductor as illustrated in FIG. 9. In some embodiments, if it is desirable to reduce the effective inductance of the primary inductor, $V_c$ is periodically switched 180° out-of-phase as compared to the voltage across the primary inductor. This introduces a current Lux that will flow through the auxiliary inductor, which creates an alternating flux that partially cancels the flux that is created due to the ripple current in the primary inductor. Accordingly, the peak to peak ripple current on the primary inductor may increase to balance the power and flux on the core.

Figure 10:
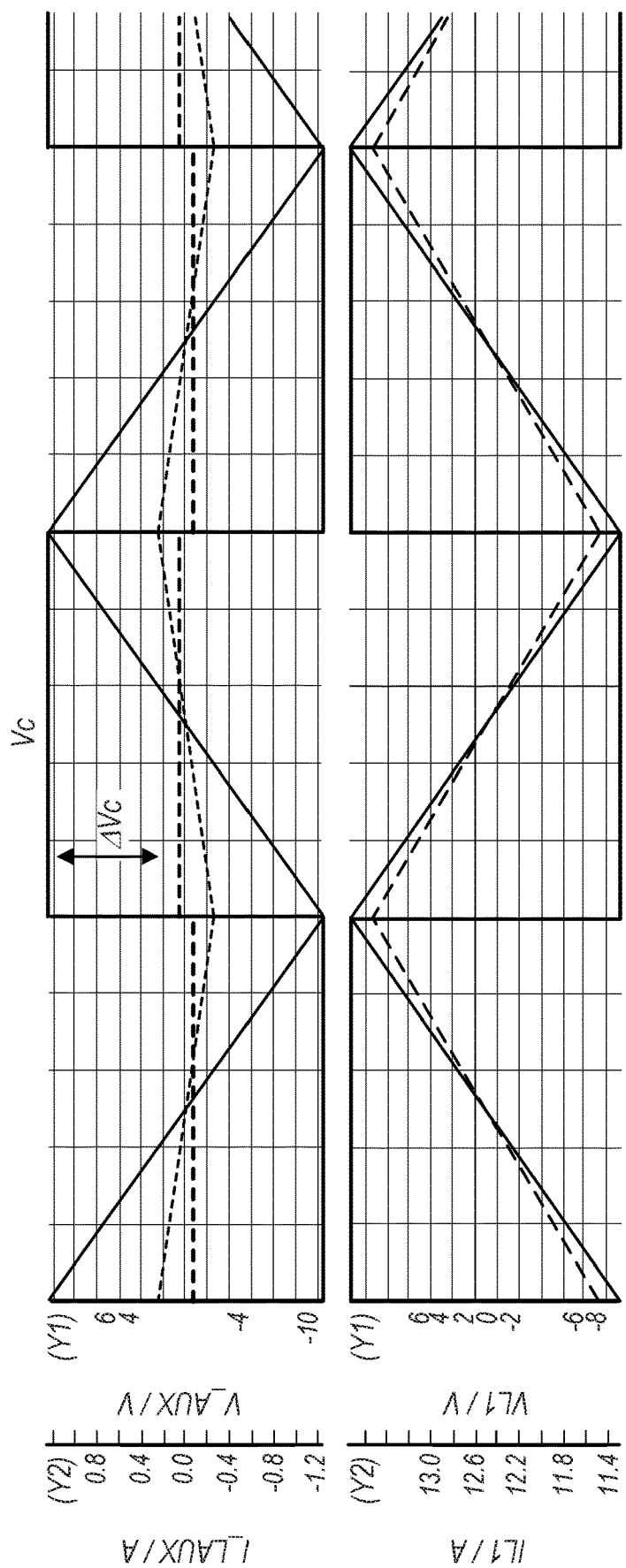
FIG. 10 is a graph illustrating the effect of the auxiliary inductor on the effective inductance of the primary inductor, according to some embodiments.

Advantageously, the coupling of the primary and auxiliary inductors combined with their 180° out-of-phase voltage oscillations may have a similar effect as if the physical inductance of the primary inductor, $L_1$ has been decreased, as illustrated in FIG. 10. By varying $V_c$, the magnitude of the peak-to-peak current through the auxiliary inductor, $I_{aux}$, may be varied. As a result of the balancing of the flux and power on each winding, the peak-to-peak ripple on the primary inductor is effectively varied, as well as its effective inductance.

In some embodiments, instead of switching the auxiliary inductor voltage 180° out-of-phase with respect to the oscillating voltage across the primary inductor, the auxiliary and primary inductor voltages may be switched in phase. In this case the effect would be opposite and the effective inductance of the primary inductor may be increased rather than decreased.

Figure 11:
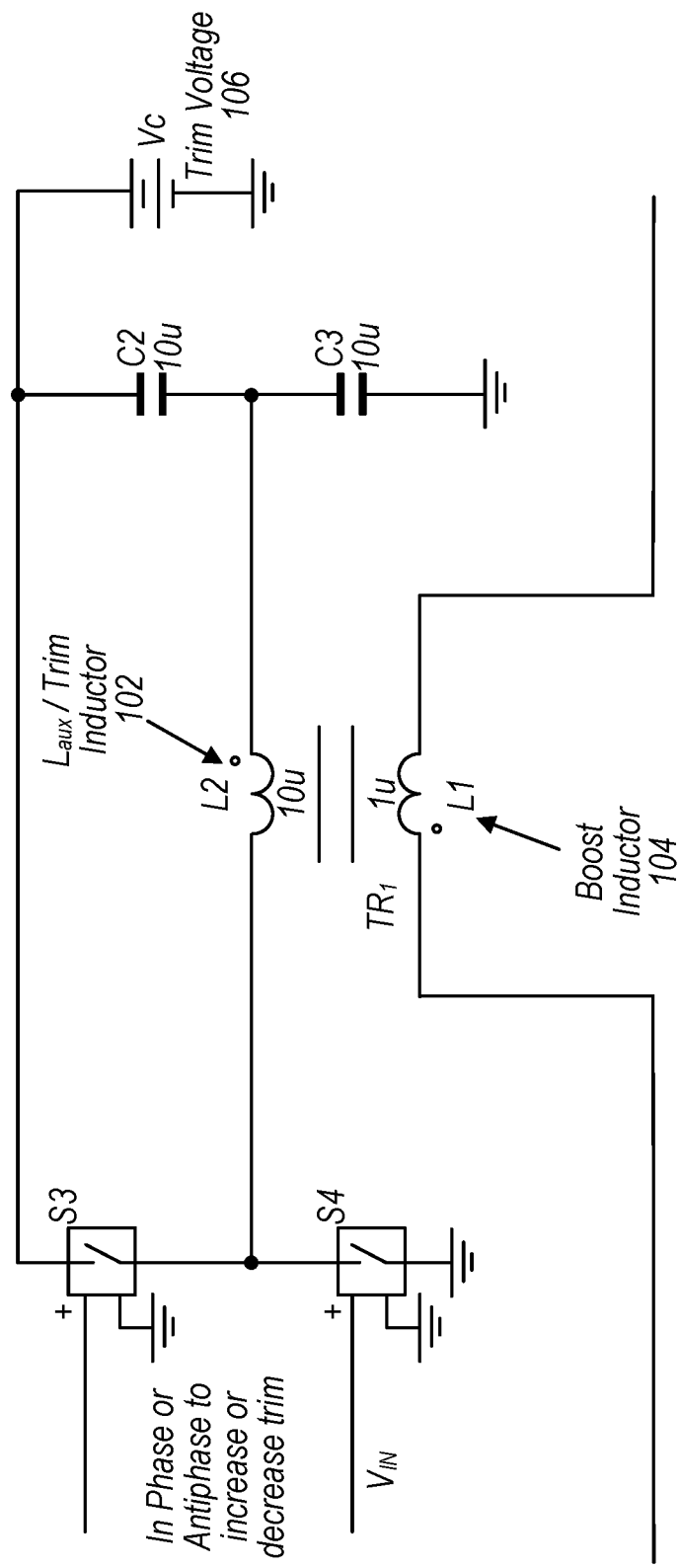
FIG. 11 is a circuit diagram illustrating a practical implementation of an auxiliary inductor coupled to a trim voltage to electronically modify a primary inductor, according to some embodiments.

FIG. 11 is a circuit diagram illustrating a practical implementation of an auxiliary inductor 102 coupled to a trim voltage $V_c$ 106, to electronically modify a primary inductor (also called a boost inductor) 104. As illustrated, instead of a floating trim voltage source, a half bridge topology is used to create an effective AC square wave across the auxiliary inductor. By varying the magnitude of $V_c$, the effective inductance of $L_1$ may be changed to either increase or decrease depending on whether the phase switching of the half bridge S3 and S4 is in phase or out-of-phase with the switching voltage across the primary side of the boost inductor, L1.

Mathematical Background

The following paragraphs provide further detail regarding the function of the electronically adjustable inductor circuit, according to electromagnetic theory. If the $L_2$ inductor is isolated from $V_c$, the voltage across the $L_2$ inductor, $V_{L2}$, is related to the number of turns of winding $N_{L2}$ and the rate of change of the magnetic field flux $$\frac{d\varphi}{dt}$$

by the following equation:

$$V_{L2} = N_{L2} \cdot \frac{d\varphi}{dt}$$

For two windings, L1 and L2 (Laux) that are mutually coupled, the power at the primary and secondary winding should likewise balance according to the following equation:

$$P_{L1} = P_{L2}$$

For embodiments including two parallel sub-circuits with a first duty cycle of 50%, the ripple current across $L_1$ and $L_2$ will be triangular in shape. In these embodiments, the root-mean-square (rms) current and voltage across $L_1$ and $L_2$ will be related to the peak currents across $L_1$ and $L_2$ according to the following equations:

$$I_{rmsL1} = \frac{1}{\sqrt{3}} \cdot I_{peakL1} \text{ and}$$

$$I_{rmsL2} = \frac{1}{\sqrt{3}} \cdot I_{peakL2}$$

$$V_{rmsL1} = V_{pL1} \text{ and}$$

$$V_{rmsL2} = V_{pL2}$$

Because the power at both inductors will be equal, it can be shown that:

$$I_{peakL1} \cdot V_{rmsL1} = I_{peakL2} \cdot V_{rmsL2}$$

And from there, it may be derived that:

$$I_{peakL1} \cdot V_{rmsL1} = \frac{V_{rmsL2}}{2 \cdot L_2 \cdot f_{sw}}$$

$V_{rmsL2}^2$ may be replaced by the trim voltage $V_c$, resulting in the following equation:

$$I_{peakL1} \cdot V_{rmsL1} = \frac{V_c^2}{2 \cdot L_2 \cdot f_{sw}}$$

From this equation we note that adjusting $V_c$ may be utilized to adjust the peak-to-peak ripple of the primary inductor's current. From the outside, this appears to change the inductance of $L_1$, thus enabling the effective inductance of $L_1$ to be tuned such that the multiple primary inductors may be adjusted to have the same or substantially the same effective inductance, even if the physical inductances of the primary inductors differs by a substantial amount.

Practical Implementation of Electronically Adjustable Inductors

Figure 12:
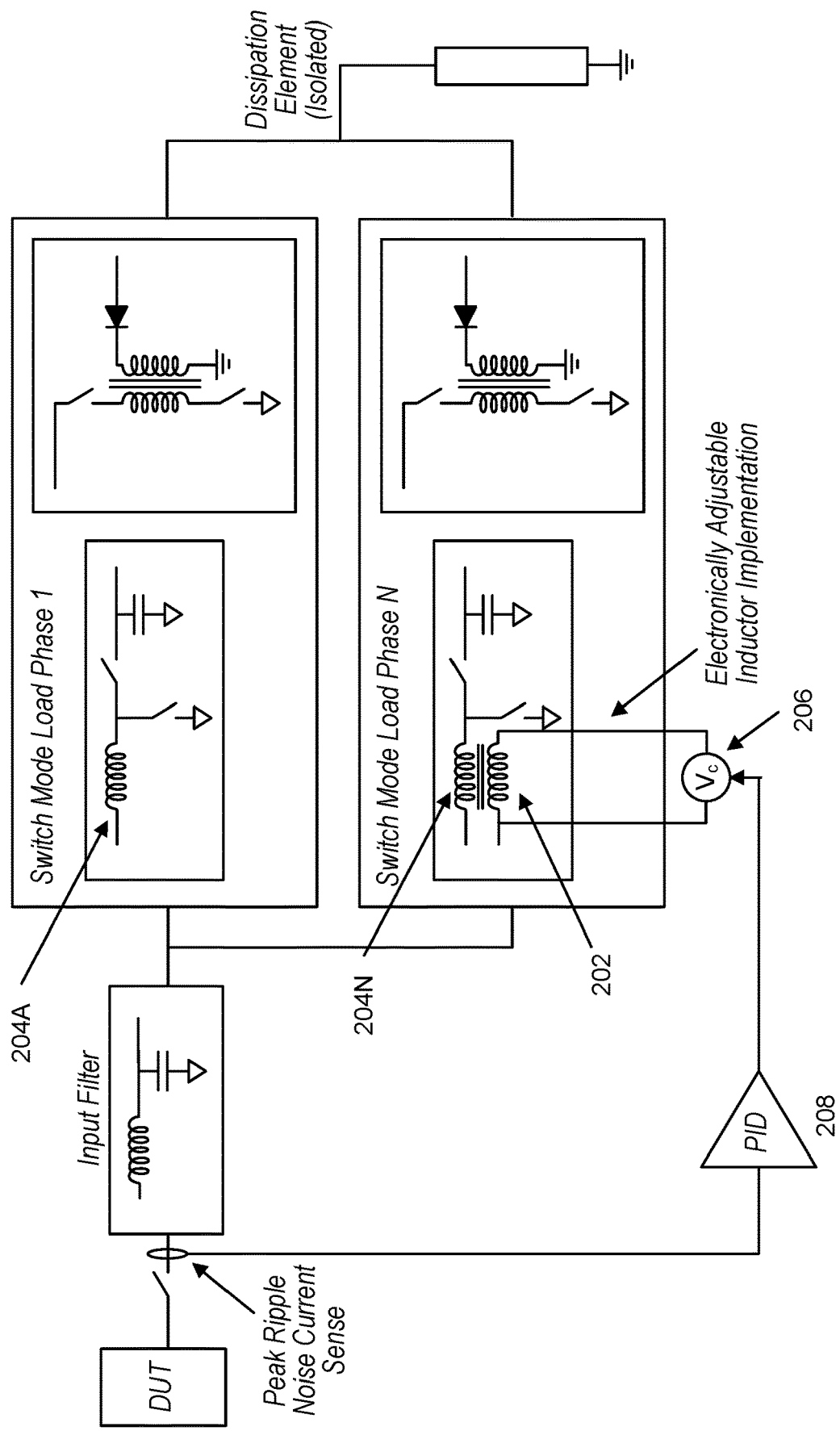
FIG. 12 is a circuit diagram illustrating a practical implementation of electronically adjustable inductors, according to some embodiments.

In some embodiments, electronically adjustable inductors are utilized for the purpose of improving the input current ripple cancellation of an N-phase boost operating at a first duty cycle. FIG. 12 is a circuit diagram illustrating a practical implementation of these embodiments. As illustrated, the peak input ripple noise may be sensed, amplified appropriately, and fed through a proportional integral differentiable (PID) or another similar control element 208 whose output may continuously adjust the phase and amplitude of Vc 206, to reduce the peak input current ripple noise as sensed at the input of the feedback loop. The PID or other control element may be either analog or digital, according to various embodiments. Advantageously, the circuit illustrated in FIG. 12 may adaptively adjust $V_c$ to reduce inductance mismatch in real time, resulting in effective current ripple cancellation.

In some embodiments, a circuit includes a plurality of sub-circuits connected in parallel between an input and an output of the circuit. Each sub-circuit may include a primary inductor 204A-N and an auxiliary inductor 202 inductively coupled to the primary inductor 204N. Each sub-circuit may further include first circuitry coupled to the primary inductor, wherein the first circuitry is configured to introduce an oscillating first voltage across the primary inductor, and second circuitry coupled to the auxiliary inductor, wherein the second circuitry is configured to introduce an oscillating second voltage $V_c$ 206 across the auxiliary inductor. The amplitudes of the second voltages may be selected to reduce a difference between effective inductances of the primary inductors. For example, the oscillating second voltages may induce a current in the auxiliary inductors, which may in turn alter the effective inductance of the primary inductor.

In some embodiments, a control element or control device may be included in the circuit to measure the physical inductances of each of the primary inductors. The control element may then automatically determine appropriate values for the magnitude of the second voltages and/or it may determine a phase for the oscillation of the second voltages to match the effective inductances of the primary inductors. For example, in some embodiments the control device may be a proportional integral differentiable (PID) or another similar control element whose output may continuously adjust the phase and amplitude of $V_c$, to reduce the peak input current ripple noise as sensed at the input of the feedback loop.

In some embodiments, the control element may automatically determine a set of adjustments to the second voltages to match the effective inductances of the primary inductors with a smallest possible total magnitude for the second voltages. For example, the control element may perform a minimization calculation to determine a set of magnitudes and/or phases for the second voltages which results in an effective inductance match between the primary inductors while simultaneously utilizing a smallest possible amount of aggregate secondary voltage magnitudes. Effectively, this may result in adjusting the effective inductances of the primary inductors to converge on the average of the physical inductances of the plurality of primary inductors, for example. In other embodiments, there may be a particular value for the effective inductance of the primary inductors that is desirable, and the control element may automatically adjust the second voltages and/or phases to obtain the desired effective inductance for all the primary inductors. Other control schemes are also possible, as desired. Advantageously, the control element may perform these adjustments automatically, without requiring user input during the inductor adjustments.

In some embodiments, the first voltage and the second voltage oscillate with a common period, but they may be in phase or 180° out-of-phase depending on whether it is desirable to increase or decrease the effective inductance of a particular primary inductor, for example.

In some embodiments, the second circuitries each include a direct current (DC) trim voltage source coupled to the respective first voltage, and the amplitudes of the second voltages are adjusted by adjusting magnitudes of the respective DC trim voltages. In some embodiments, the second circuitry further includes switch circuitry configurable in a first state and a second state, wherein, while the switch circuitry is in the first state, the second voltage oscillates in phase with the first voltage, and wherein, while the switch circuitry is in the second state, the second voltage oscillates 180° out-of-phase with the first voltage.

In some embodiments, the first voltage introduced across a first one of the primary inductors and the second voltage introduced across a first one of the auxiliary inductors oscillate in phase, and the effective inductance of the first one of the primary inductors is greater than the physical inductance of the first one of the primary inductors.

In some embodiments, the first voltage introduced across a first one of the primary inductors and the second voltage introduced across a first one of the auxiliary inductors oscillate 180° out-of-phase, and the effective inductance of the first one of the primary inductors is lower than the physical inductance of the first one of the primary inductors.

In some embodiments, the circuit is a programmable load circuit, and each sub-circuit further includes a switch that is configurable in a first state and a second state, wherein while the switch is in the first state the primary inductor of the respective sub-circuit is connected to the output through a load, and wherein while the switch is in the second state a connection is established between the primary inductor of the respective sub-circuit and the output that bypasses the load. In these embodiments, the switches of the plurality of sub-circuits are configured to periodically switch between the first state and the second state with a period corresponding to a period of oscillation of the first voltages, and the switches are out of phase with each other by a fixed amount, wherein the fixed amount is selected to reduce a variance over time in a summation over currents passing through the plurality of sub-circuits.

APPENDIX: SUPPLEMENTARY DETAIL ON PROGRAMMABLE LOAD CIRCUITS

The following paragraphs provide additional detail on the methods and circuits utilized to realize a programmable load circuit, according to various embodiments.

Continuously Adjustable Programmable Load Circuits

While the circuit illustrated in FIG. 1 achieves the desired current ripple cancellation, the realizable loads of the programmable load module for this circuit are limited to a discrete set of loads resultant from a corresponding discrete set of duty cycles. Specifically, for an N-phase programmable load circuit, there are N−1 duty cycles that may result in the desired ripple cancellation. For example, in the case of a 2-phase boost implementation, in order to achieve full cancellation, the duty cycle would be fixed at 50%, resulting in a single value of the realizable load of the entire circuit. It is desirable for programmable load modules to be programmable to exhibit a continuous range of loads, and embodiments described below introduce additional circuit elements to address these and other concerns.

Figure 13:
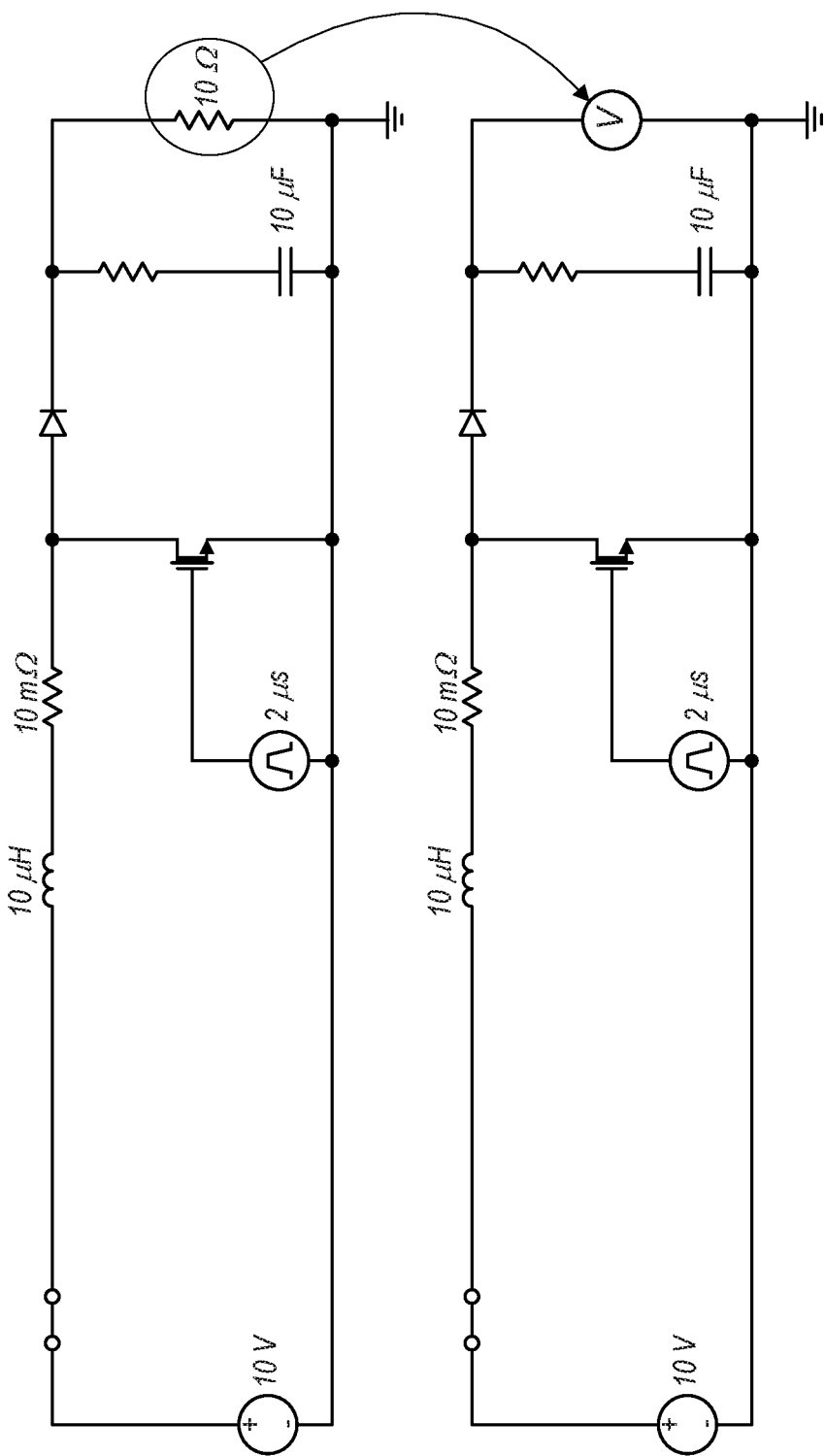
FIG. 13 illustrates a circuit diagram for a programmable load circuit that replaces the resistor with an idealized voltage source, according to some embodiments.

In some embodiments, the sub-circuit topology is modified as illustrated in FIG. 13. For simplicity, only a single phase of the N-phase topology is shown in FIG. 13, however it is understood that this may be repeated across the N phases of the overall circuit. As shown in FIG. 13, the load resistor of the boost regulator is replaced with an ideal voltage source, which we refer to as a boost output voltage load.

The ripple current equation of the boost inductor may be expressed as $\Delta I=V_{inductor}/L$. This equation indicates that while the boost MOSFET switch is "off" and the boost output diode is conducting current, the voltage across the inductor $V_{inductor}$ is approximately equal to the difference between the input voltage from the DUT (10V as illustrated in FIG. 13, although other voltages may be used) and the new boost output voltage load, $V_{out\_load}$ as illustrated in FIG. 14.

Figure 14:
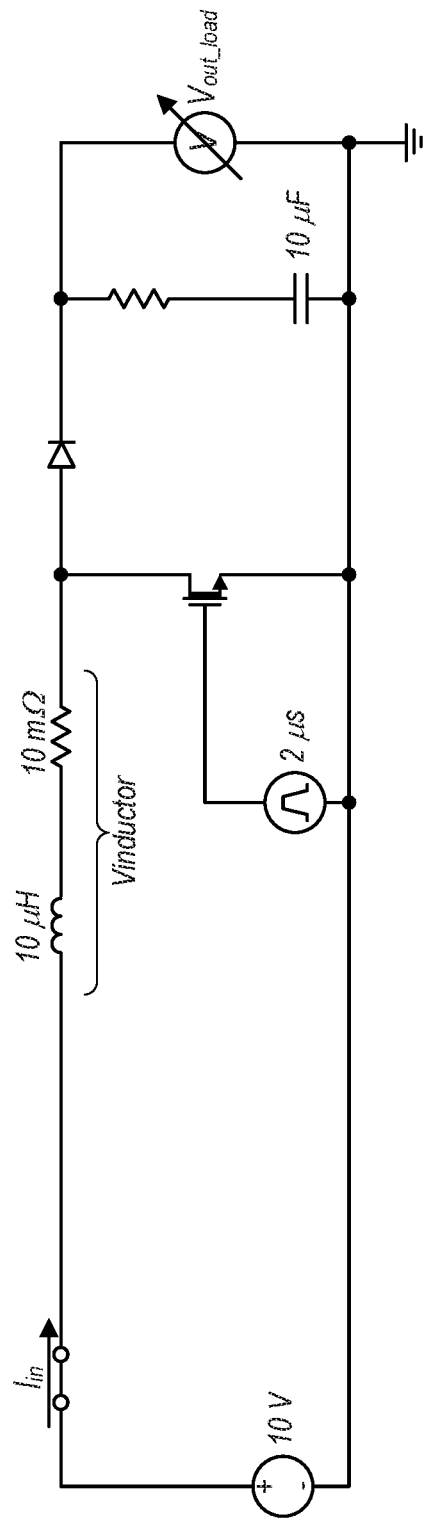
FIG. 14 is a circuit diagram illustrating how the current drawn from the DUT may be varied by varying the voltage of the voltage source, according to some embodiments.

As can be seen in FIG. 14, with a fixed pulse width modulation (PWM) duty cycle on the boost stage, the current drawn from the DUT, $I_{in}$, may be varied by varying the voltage of the voltage source, $V_{out\_load}$.

Advantageously, the circuit illustrated in FIG. 14 is configured to vary $I_{in}$ without changing the duty cycle of the boost stage, which may stay at a desirable duty cycle for input ripple current cancellation (e.g., which may depend on the desired operating point and the number, N, of phases of the boost stage that are employed and/or active in the circuit). It may be noted here that $V_{out\_load}$ here dissipates substantially all the power that the programmable load is set to.

The circuit diagrams illustrated in FIGS. 13 and 14 represent theoretical devices, and the following paragraphs and Figures illustrate practical implementations of $V_{out\_load}$ with specific circuit elements, according to various embodiments.

Figure 15:
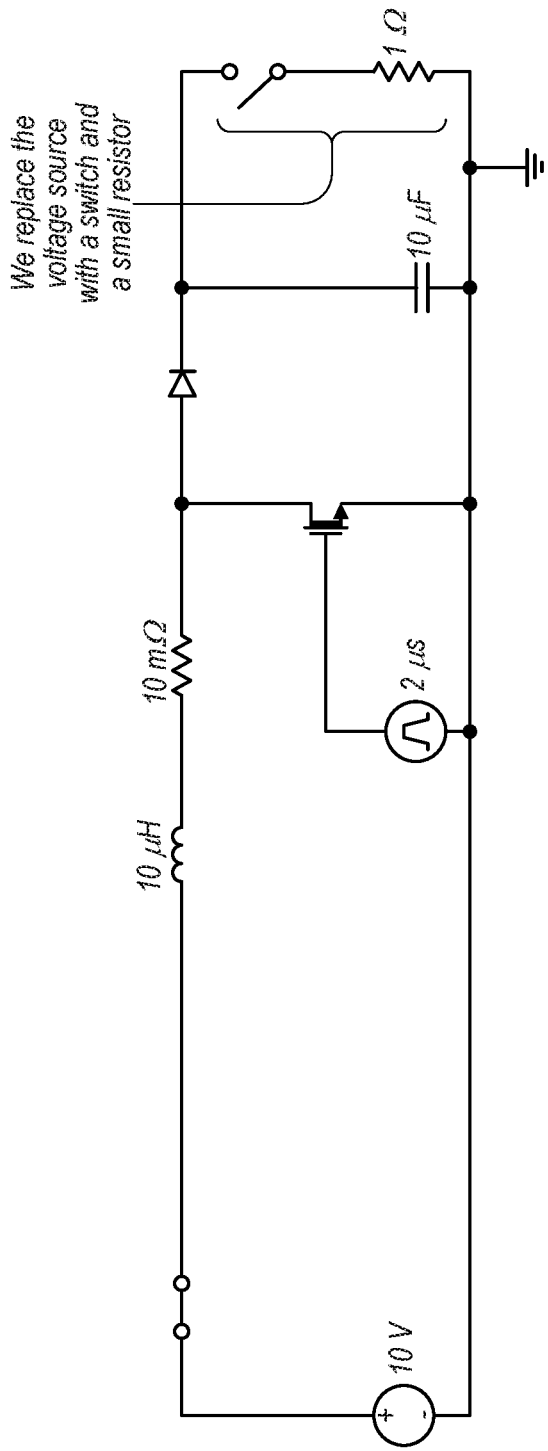
FIG. 15 is a circuit diagram of a programmable load circuit where the idealized voltage source is replaced with a resistor connected in series with a switch, according to some embodiments.

As illustrated in FIG. 15, the idealized voltage source is replaced with a switch and a small resistor (the resistor is 1Ω in FIG. 15, although other values are also possible). To avoid confusion, we refer to this switch as a "second switch", to contrast it with the MOSFET boost switch that is configured to open a short circuit between the inductor and the 10V DUT, which we shall refer to as the "first switch".

Figure 16:
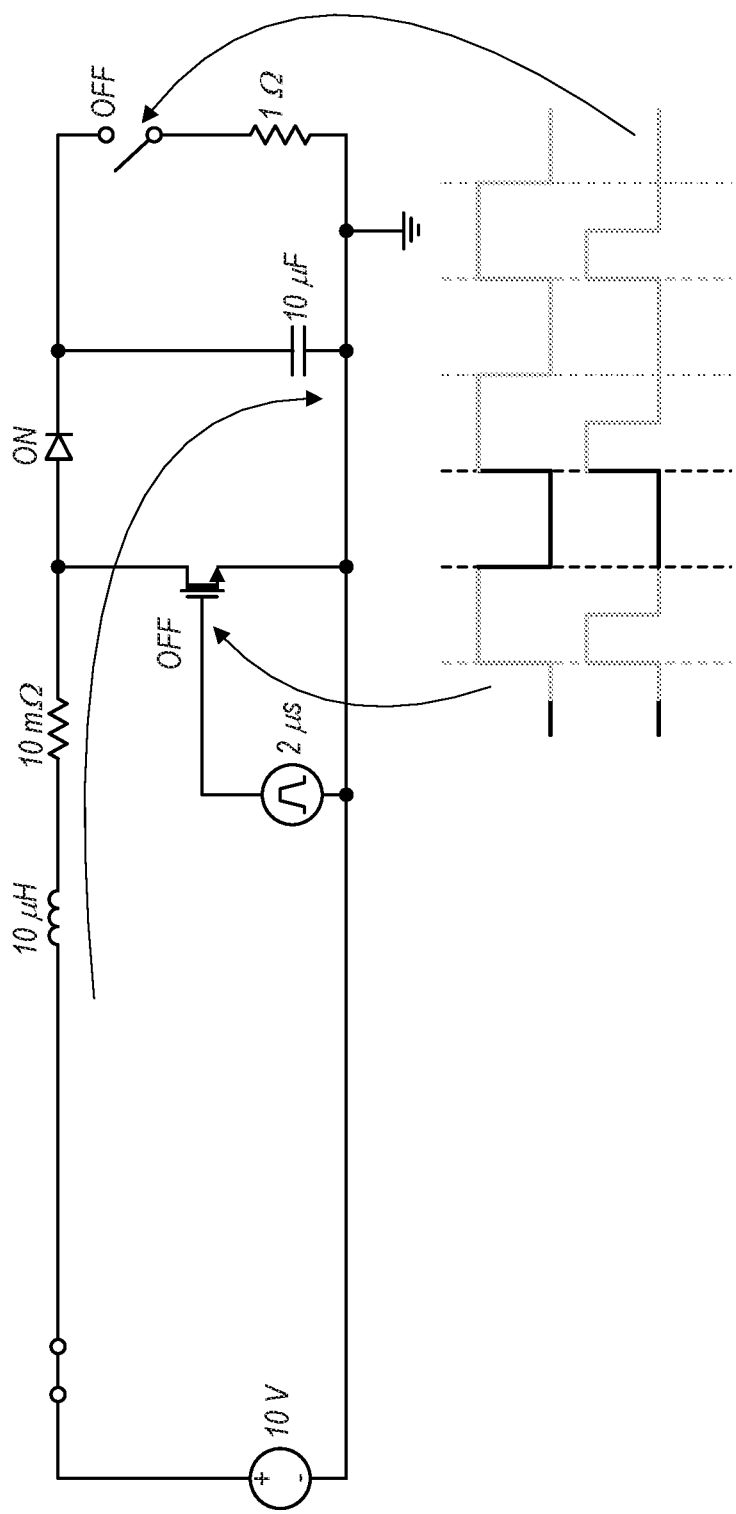
FIG. 16 illustrates a first phase of operation of a programmable load circuit when both the first switch and the second switch are off, according to some embodiments.

FIG. 16 illustrates operation of the circuit shown in FIG. 15 during a first portion of the periodic circuit operation. Specifically, FIG. 16 illustrates a first phase of operation when both the first switch and the second switch are "off" (i.e., the short circuit path from the inductor through the first switch to the DUT is closed, the current through the second switch is closed, and current is directed through the 10 µF capacitor). During this first phase of operation, the inductor current charges the output capacitor (10 uF).

Figure 17:
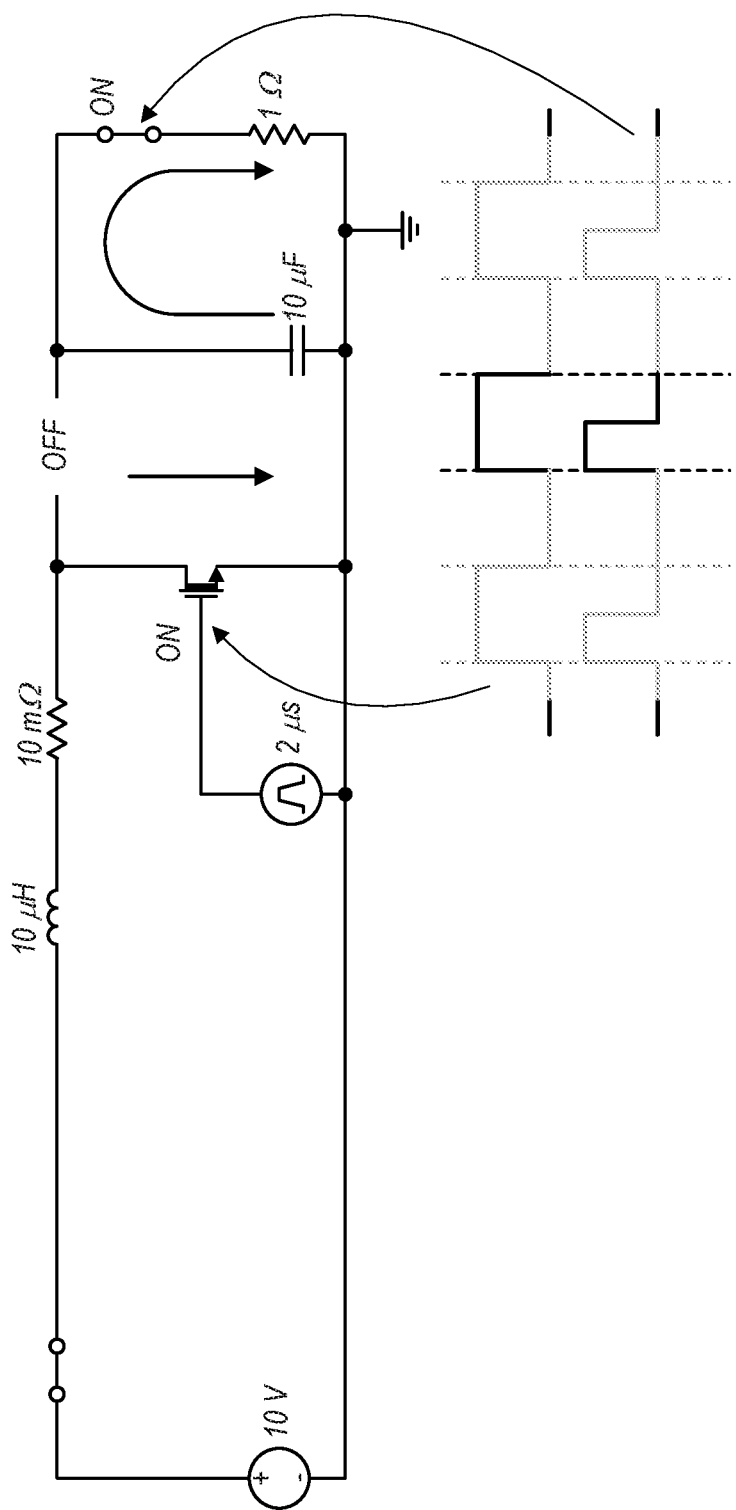
FIG. 17 illustrates a second phase of operation of a programmable load circuit where both the first switch and second switch turn on so that current may pass through both switches, according to some embodiments.

A subsequent, second phase of operation is illustrated in FIG. 17, where both the first switch and second switch turn on so that current may pass through both switches. When the first switch turns on, the boost diode effectively turns off since the boost inductor is shorted to ground. Accordingly, the current through the inductor rises. At the same time, the second switch turns on and discharges the 10 µF capacitor. The amount of discharge is proportional to the time that the second switch remains on, which is proportional to the second duty cycle of the second switch. Notice that at this point, the inductor sub-circuit is 'separated' from the capacitor sub-circuit, and hence the inductor's current ripple and the linearity of its ripple current is not affected by the behavior of the capacitor sub-circuit. This is advantageous, since non-linearity of the inductor's ripple current may degrade the effective input ripple current cancellation of the N phases.

Importantly, the first switch and the second switch may operate according to different first and second duty cycles, respectively. As illustrated in FIG. 17, the second switch may turn off before the first switch, and generally the second duty cycle may take any value ranging from zero up to the first duty cycle. Adjusting the second duty cycle may adjust the degree to which the 10 µF capacitor discharges, which correspondingly adjusts the effective voltage seen by the inductor. Advantageously, the overall load of the programmable load circuit may be continuously adjusted by continually adjusting the second duty cycle while the first duty cycle remains fixed.

Figure 18:
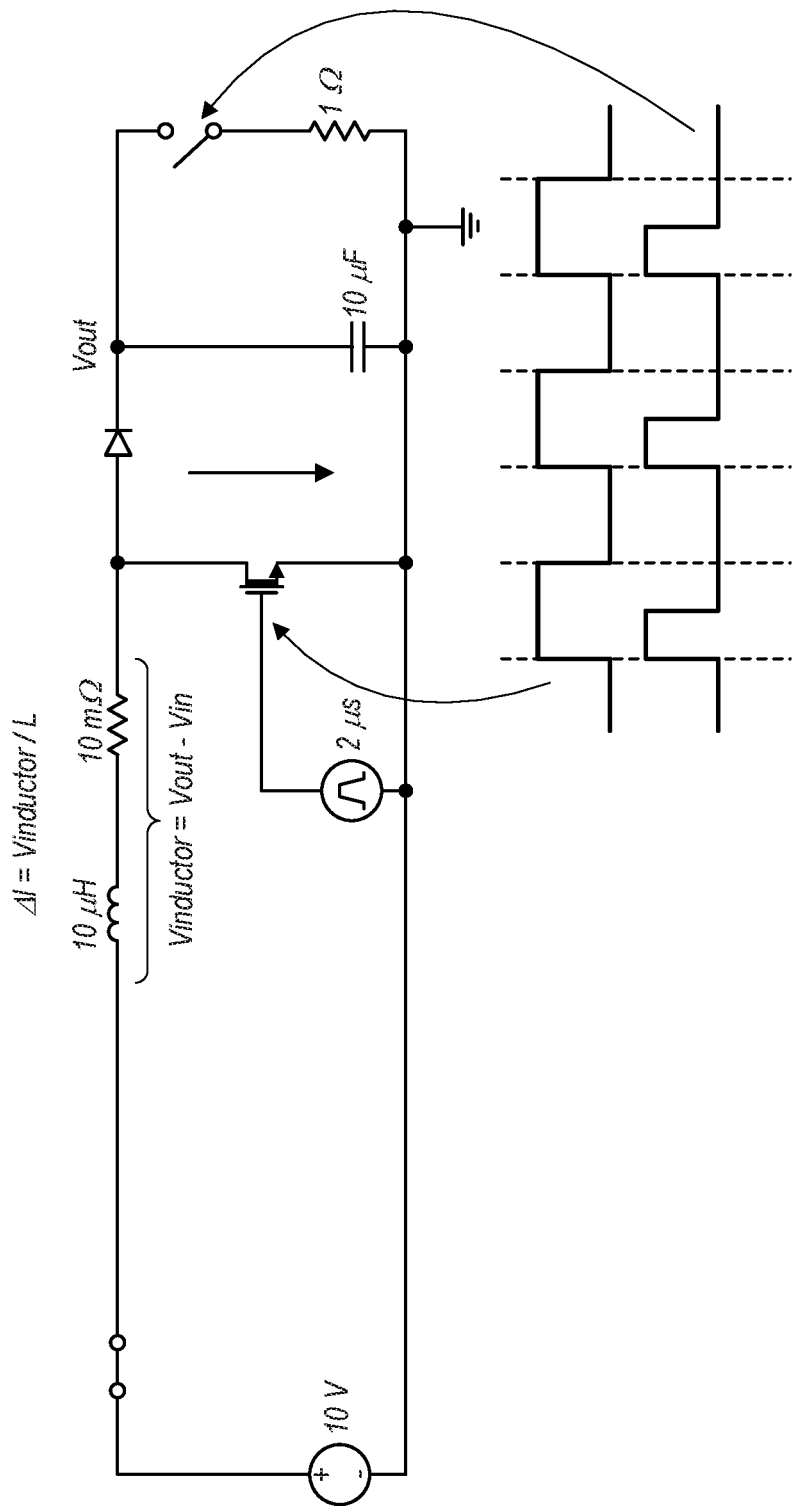
FIG. 18 illustrates repetition of the cycle of operation of a programmable load circuit over several periods, according to some embodiments.

FIG. 18 illustrates repetition of this cycle of operation over several periods. Advantageously, the inductor sees an approximately constant $V_{out}$ during operation of this circuit, such that the functionality of the idealized voltage source illustrated in FIGS. 13-14 is effectively realized.

Figure 19:
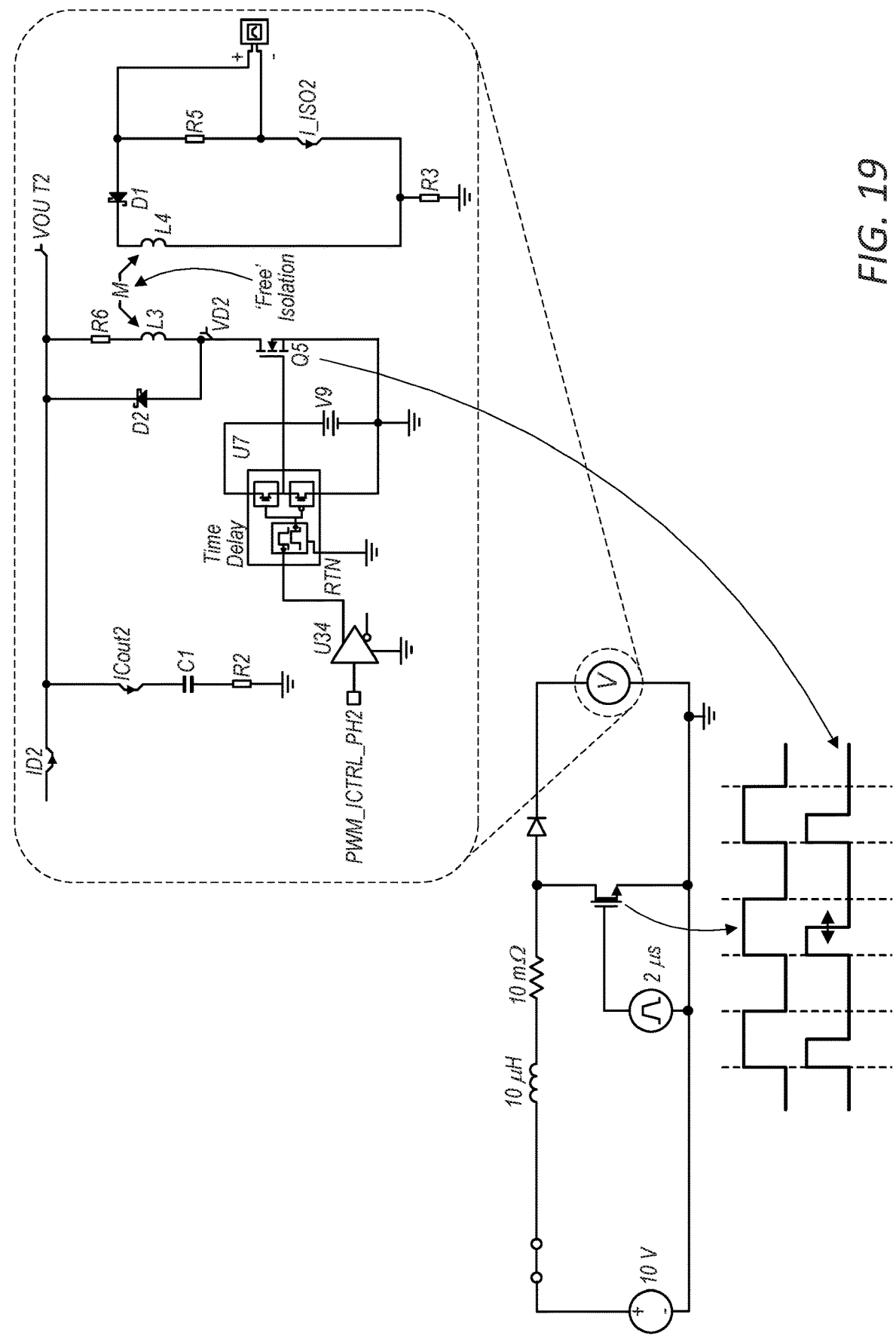
FIG. 19 is a circuit diagram illustrating a flyback topology for the load of a programmable load circuit, according to some embodiments.

FIG. 19—Flyback Topology

In some embodiments, the setup of the output switch and resistor is replaced by a flyback topology as shown in the schematic circuit diagram illustrated in FIG. 19. Advantageously, using a flyback achieves isolation between the input stage and the output stage where the 'load' resistor is located.

FIG. 20 illustrates a schematic multi-phase programmable load topology, according to some embodiments. Although FIG. 20 illustrates a specific example with only 2 phases of boost with their associated flyback switches, it should be understood to be within the scope of the present disclosure that this may also be implemented in any number of phases. With 2 phases, the primary boost stage would operate at 50% duty cycle, whereas with additional phases, there may be additional duty cycle operating points that result in full or almost full input ripple cancellation.

In FIG. 20, the final dissipation element is an isolated output resistor on the right side which may optionally be located remote from the main control circuitry consisting of the boost and flyback stages, as well as their associated analog and/or digital control circuitry.

Programmable Load Circuit

In some embodiments, a programmable load circuit includes a plurality of first sub-circuits connected in parallel between an input and an output of the programmable load circuit. The input may be configured to attach to a DUT or another type of device for which it is desired to introduce a programmable load. The output may connect back to the DUT or other device, or it may alternatively connect to ground.

In some embodiments, each sub-circuit may include an inductor and a switch that is configurable in a first state and a second state. While the switch is in the first state the inductor is connected to the output through a load, and while the switch is in the second state a connection is established between the inductor and the output that bypasses the load.

The switches of the plurality of first sub-circuits are configured to periodically switch between the first state and the second state, in some embodiments. The switches may be out of phase with each other by a fixed amount, and the fixed amount is selected to reduce a variance over time in a summation over currents passing through the plurality of first sub-circuits. For example, for embodiments where there are four sub-circuits, each subsequent sub-circuit may be out-of-phase with a previous sub-circuit by a fixed amount (e.g., the four sub-circuits may operate with relative phases of 0°, 90°, 180°, and 270°).

In some embodiments, the fixed amount is a fraction of the period of the switching between the first state and the second state, wherein the denominator of the fraction is equal to the number of first sub-circuits in the plurality of first sub-circuits. In other words, the fixed amount may be a fraction such as T/n, where T is the period during which the first switches complete an entire cycle, and n is the number of first sub-circuits.

A duty cycle of the periodic switching between the first state and the second state may be determined based at least in part on the number of first sub-circuits in the plurality of first sub-circuits. The duty cycle of the periodic switching between the first state and the second state may be equal to n/m, where m is the number of first sub-circuits in the plurality of first sub-circuits and n is a positive integer smaller than m.

In some embodiments, the load includes a second sub-circuit that includes a capacitor connected in parallel to a switchable fixed resistor, wherein the switchable fixed resistor is configured to periodically switch between an on state and an off state. The switchable fixed resistor may be configured to be in the off state while the switch is in the second state, and the switchable fixed resistor may be configured to be in the on state for at least a portion of the time that the switch is in the first state. The portion of the time that the switchable fixed resistor is in the on state while the switch is in the first state may be adjustable to tune an effective resistance of the load. For example, FIG. 16 illustrates one embodiment of a second sub-circuit.

In some embodiments, the load may be composed of a second sub-circuit connected to the inductor, and a load-bearing sub-circuit inductively connected to a second sub-circuit. For example, as illustrated in FIG. 19, a flyback topology may be employed wherein the load bearing portion of each first sub-circuit is isolated from the portion of the first sub-circuit that is conductively connected to the inductor.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include," and derivations thereof, mean "including, but not limited to." As used in this specification, the singular forms "a," "an," and "the" include plural referents unless the content clearly indicates otherwise. Thus, for example, reference to "a device" includes a combination of two or more devices.

I claim:

1. A circuit, comprising:
a plurality of sub-circuits connected in parallel between an input and an output of the circuit, wherein each sub-circuit of the plurality of sub-circuits comprises:
a respective primary inductor; and
respective first circuitry coupled to the primary inductor, wherein the first circuitry is configured to introduce a respective oscillating first voltage across the primary inductor; and
wherein at least one sub-circuit of the plurality of sub-circuits further comprises:
a respective auxiliary inductor inductively coupled to the respective primary inductor;
respective second circuitry coupled to the auxiliary inductor, wherein the second circuitry is configured to introduce a respective oscillating second voltage across the auxiliary inductor; and
a control element configured to select an amplitude of the oscillating second voltage of the respective sub-circuit, wherein the amplitude is selected to reduce a difference between an effective inductance of the primary inductor of the respective sub-circuit and an effective inductance of at least one primary inductor of another sub-circuit of the plurality of sub-circuits.

2. The circuit of claim 1,
wherein the respective first voltages and the respective second voltages oscillate with a common period.

3. The circuit of claim 1,
wherein each second circuitry comprises a respective direct current (DC) trim voltage source coupled to the respective first voltage, and
wherein the amplitudes of the second voltages are adjusted by adjusting magnitudes of the respective DC trim voltages.

4. The circuit of claim 3,
wherein, for the at least one sub-circuit:
the respective second circuitry further comprises respective switch circuitry configurable in a first state and a second state,
wherein, while the switch circuitry is in the first state, the respective second voltage oscillates in phase with the respective first voltage, and
wherein, while the switch circuitry is in the second state, the respective second voltage oscillates 180° out-of-phase with the respective first voltage.

5. The circuit of claim 1,
wherein the respective first voltage introduced across a first one of the primary inductors and the respective second voltage introduced across a first one of the auxiliary inductors oscillate in phase, and
wherein the effective inductance of the first one of the primary inductors is greater than a physical inductance of the first one of the primary inductors.

6. The circuit of claim 1,
wherein respective the first voltage introduced across a first one of the primary inductors and the respective second voltage introduced across a first one of the auxiliary inductors oscillate 180° out-of-phase, and
wherein the effective inductance of the first one of the primary inductors is lower than a physical inductance of the first one of the primary inductors.

7. The circuit of claim 1,
wherein the circuit is a programmable load circuit,
wherein each sub-circuit further comprises:
a respective switch that is configurable in a first state and a second state, wherein while the switch is in the first state the primary inductor of the respective sub-circuit is connected to the output through a load, and wherein while the switch is in the second state a connection is established between the primary inductor of the respective sub-circuit and the output that bypasses the load;
wherein the switches of the plurality of sub-circuits are configured to periodically switch between the first state and the second state with a period corresponding to a period of oscillation of the first voltages, wherein the switches are out of phase with each other by a fixed amount, and wherein the fixed amount is selected to reduce a variance over time in a summation over currents passing through the plurality of sub-circuits.

8. A circuit, comprising:
a plurality of sub-circuits, wherein each sub-circuit of the plurality of sub-circuits comprises:
a respective primary inductor; and
respective first circuitry coupled to the primary inductor, wherein the first circuitry is configured to introduce an oscillating first voltage across the primary inductor; and
wherein at least one sub-circuit of the plurality of sub-circuits further comprises:
a respective auxiliary inductor inductively coupled to the respective primary inductor;
respective second circuitry coupled to the auxiliary inductor, wherein the second circuitry is configured to introduce an oscillating second voltage across the auxiliary inductor; and
a control element configured to select an amplitude of the oscillating second voltage of the respective sub-circuit, wherein the amplitude is selected to reduce a difference between an effective inductance of the primary inductor of the respective sub-circuit and an effective inductance of at least one primary inductor of another sub-circuit of the plurality of sub-circuits.

9. The circuit of claim 8,
wherein the respective first voltages and the respective second voltages oscillate with a common period.

10. The circuit of claim 8,
wherein each second circuitry comprises a respective direct current (DC) trim voltage source coupled to the respective first voltage, and
wherein the amplitudes of the second voltages are adjusted by adjusting magnitudes of the respective DC trim voltages.

11. The circuit of claim 10,
wherein, for the at least one sub-circuit:

the respective second circuitry further comprises respective switch circuitry configurable in a first state and a second state, wherein, while the switch circuitry is in the first state, the respective second voltage oscillates in phase with the respective first voltage, and wherein, while the switch circuitry is in the second state, the respective second voltage oscillates 180° out-of-phase with the respective first voltage.

12. The circuit of claim 8,
wherein the respective first voltage introduced across a first one of the primary inductors and the respective second voltage introduced across a first one of the auxiliary inductors oscillate in phase, and wherein the effective inductance of the first one of the primary inductors is greater than a physical inductance of the first one of the primary inductors.

13. The circuit of claim 8,
wherein the respective first voltage introduced across a first one of the primary inductors and the respective second voltage introduced across a first one of the auxiliary inductors oscillate 180° out-of-phase, and wherein the effective inductance of the first one of the primary inductors is lower than a physical inductance of the first one of the primary inductors.

14. The circuit of claim 8,
wherein the control element is further configured to:
    measure a mismatch between effective inductances of the respective primary inductors;
    automatically direct the respective second circuities to adjust the respective second voltages based at least in part on the mismatch.

15. A programmable load circuit, comprising:
a plurality of sub-circuits connected in parallel between an input and an output of the programmable load circuit, wherein each sub-circuit of the plurality of sub-circuits comprises:
    a respective primary inductor;
    a respective load; and
    respective first circuitry coupled to the primary inductor, wherein the first circuitry is configured to introduce a respective oscillating first voltage across the primary inductor;
wherein at least one sub-circuit of the plurality of sub-circuits further comprises:
    an auxiliary inductor inductively coupled to the primary inductor;
    respective second circuitry coupled to the auxiliary inductor, wherein the second circuitry is configured to introduce a respective oscillating second voltage across the auxiliary inductor; and
    a control element configured to select an amplitude of the oscillating second voltage of the respective sub-circuit, wherein the amplitude is selected to reduce a difference between an effective inductance of the primary inductor of the respective sub-circuit and an effective inductance of at least one primary inductor of another sub-circuit of the plurality of sub-circuits,
wherein the oscillating first voltages of the plurality of sub-circuits are out of phase with each other by a predetermined amount, and wherein the predetermined amount is operable to reduce a variance over time in a summation of currents passing through the plurality of sub-circuits.

16. The programmable load circuit of claim 15,
wherein, for each sub-circuit, the first circuitry comprises a respective first switch coupled to the respective primary inductor that is configurable in a first state and a second state, wherein while the first switch is in the first state the primary inductor is connected to the output through the respective load, and wherein while the first switch is in the second state a connection is established between the primary inductor and the output that bypasses the load.

17. The programmable load circuit of claim 15,
wherein, for the at least one sub-circuit:
    the respective second circuitry further comprises respective switch circuitry configurable in a first state and a second state,
    wherein, while the switch circuitry is in the first state, the respective second voltage oscillates in phase with the respective first voltage, and
    wherein, while the switch circuitry is in the second state, the respective second voltage oscillates 180° out-of-phase with the respective first voltage.

18. The programmable load circuit of claim 15,
wherein, for each sub-circuit, the first circuitry comprises a respective first switch coupled to the respective primary inductor that is configurable in a first state and a second state, wherein while the first switch is in the first state the primary inductor is connected to the output through the respective load, and wherein while the first switch is in the second state a connection is established between the primary inductor and the output that bypasses the load,
wherein the respective loads each comprise:
    a respective capacitor connected in parallel to a respective switchable resistor, wherein the switchable resistor is configured to periodically switch between an on state and an off state,
    wherein the switchable fixed resistor is configured to be in the off state while the first switch is in the second state,
    wherein the switchable fixed resistor is configured to be in the on state for at least a portion of the time that the first switch is in the first state,
    wherein a duty cycle of periodically switching the switchable resistor is programmable to adjust an overall effective load of the programmable load circuit.

19. The programmable load circuit of claim 15,
wherein the oscillating first voltages and the oscillating second voltages oscillate with a common period.

20. The programmable load circuit of claim 15,
wherein a duty cycle of the oscillating first voltages and the oscillating second voltages is programmable to adjust an overall effective load of the programmable load circuit.

* * * * *